(12) United States Patent
Gondo

(10) Patent No.: US 8,804,365 B2
(45) Date of Patent: Aug. 12, 2014

(54) DRIVER ELEMENT AND DISPLAY DEVICE

(75) Inventor: Kenji Gondo, Arakawa-ku (JP)

(73) Assignee: OPTREX Corporation, Tokyo (JP)

( * ) Notice: Subject to any disclaimer, the term of this patent is extended or adjusted under 35 U.S.C. 154(b) by 331 days.

(21) Appl. No.: 13/302,416

(22) Filed: Nov. 22, 2011

(65) Prior Publication Data

US 2012/0134120 A1 May 31, 2012

(30) Foreign Application Priority Data

Nov. 29, 2010 (JP) ................................. 2010-264894

(51) Int. Cl.
*H05K 7/00* (2006.01)
(52) U.S. Cl.
USPC ............................ 361/777; 361/748; 174/250
(58) Field of Classification Search
USPC ................. 361/777, 748; 439/60, 951, 924.1; 174/250
See application file for complete search history.

(56) References Cited

U.S. PATENT DOCUMENTS 6,297,868 B1 * 10/2001 Takenaka et al. ............. 349/151

FOREIGN PATENT DOCUMENTS

JP 2000-155330 6/2000
JP 2009-99830 5/2009

* cited by examiner

*Primary Examiner* — Andargie M Aychillhum
(74) *Attorney, Agent, or Firm* — Oblon, Spivak, McClelland, Maier & Neustadt, L.L.P.

(57) ABSTRACT

To broaden a substantial area for wiring between a display portion and a driver element, and to increase the number of wirings between the driver element and the display portion. In a driving IC 100, bumps 10, 12, 14, 16, 18, 22, 24, 26 and 28 are arrayed in a first row 110 and bumps 11, 13, 15, 17, 21, 23, 25, 27 are arrayed in a second row 120, wherein the respective bumps are disposed so that the shortest distances between forward ends of the respective bumps and a side along the array, become larger gradually from the center outward in the array.

9 Claims, 6 Drawing Sheets

(A) CONVENTIONAL EXAMPLE        (B) PRESENT INVENTION (A) CONVENTIONAL EXAMPLE (B) PRESENT INVENTION

DRIVER ELEMENT AND DISPLAY DEVICE

BACKGROUND OF THE INVENTION

1. Field of the Invention

The present invention relates to a driver element to be mounted on a display device such as a liquid crystal display device, and a display device having the driver element mounted thereon.

2. Discussion of Background

A liquid crystal display device or an organic EL (Electro Luminescence) display device is provided with a display portion in a display panel and a driver element (hereinafter referred to as a driving IC) to supply driving signals to the display portion.

As a system to connect the display portion and the driving IC, a COG (Chip On Glass) system is widely used. In the COG system, a method is commonly used wherein bumps (bump electrodes) formed on a mounting surface i.e. a surface on the side to be mounted on a glass substrate in the driving IC, are connected to electrode pads formed on the glass substrate, via a conductive material such as an anisotropically conductive film.

As shown in FIG. 9(A), in a driving IC 130 wherein the front and rear surfaces are usually formed rectangular as mounting surfaces, bumps 140 are arrayed in line along a long side on the front surface (mounting surface) (e.g. Patent Documents 1 and 2). Further, for the purpose of e.g. increasing the number of terminals without increasing the size of the driving IC 130, as shown in FIG. 9(B), a structure is also adopted wherein bumps 140 are arranged in a zigzag (or staggering) fashion (e.g. Patent Documents 1 and 2). Here, in FIGS. 9(A) and (B), bumps 140 are output terminals to output driving signals to drive the display portion, and bumps 150 are input terminals to input image signals, etc. from the side of the control device, to output image signals.

In the glass substrate on which a display portion and a driving IC are mounted, the area of a non-display portion should better be small. Accordingly, it is preferred that the driving IC is mounted close to the display portion.

Patent Document 1: JP-A-2009-99830 (FIGS. 1 and 4)
Patent Document 2: JP-A-2000-155330 (FIGS. 1 and 7)

SUMMARY OF THE INVENTION

However, since spaces (pitches) of bumps are smaller than pixel widths in the display portion, it is obliged to form a wiring pattern to be provided between the display portion and the electrode pads to which bumps are to be connected, so that it widens towards the display portion from the driving IC. However, if the driving IC is mounted close to the display portion, the wiring region becomes small, and it tends to be difficult to provide a wiring pattern. That is, it is difficult to reduce the distance between the driving IC and the display portion beyond a certain level in order for the wiring pattern to be provided.

Therefore, it is an object of the present invention to provide a driver element and a display device whereby it is possible to further reduce the distance between the driving IC and the display portion.

The driver element according to the present invention is a driver element having a rectangular shape, to be mounted on a display device containing a display portion, wherein bumps are arrayed along a side which is located close to the display portion when mounted, and the respective bumps are disposed so that the shortest distances between forward ends of the respective bumps and the side along the array, become larger gradually from the center outward in the array.

In the driver element, it is preferred that the respective bumps are disposed so that the degree of change in size of the shortest distance at each bump from the shortest distance at the bump adjacent thereto becomes larger gradually as the respective bumps depart from the center of the array.

In the driver element, it is preferred that the respective bumps are formed along a long side of the rectangular driver element, and the respective bumps are disposed so that the difference between the shortest distance at a bump at the center in the array and the shortest distance at a bump at the farthest end in the array, is at most ⅓ of the length of a short side of the rectangular driver element.

In the driver element, the forward end shape of each bump may be arc-like.

The display device according to the present invention comprises a display portion and the above-described driver element.

According to the present invention, it is possible to broaden a substantial area for wiring between the display portion and the driver element, and it is possible to further reduce the distance between the driver element and the display portion. Further, it is possible to increase the number of wirings between the driver element and the display portion.

DETAILED DESCRIPTION OF THE PREFERRED EMBODIMENTS

Embodiment 1

Figure 1:
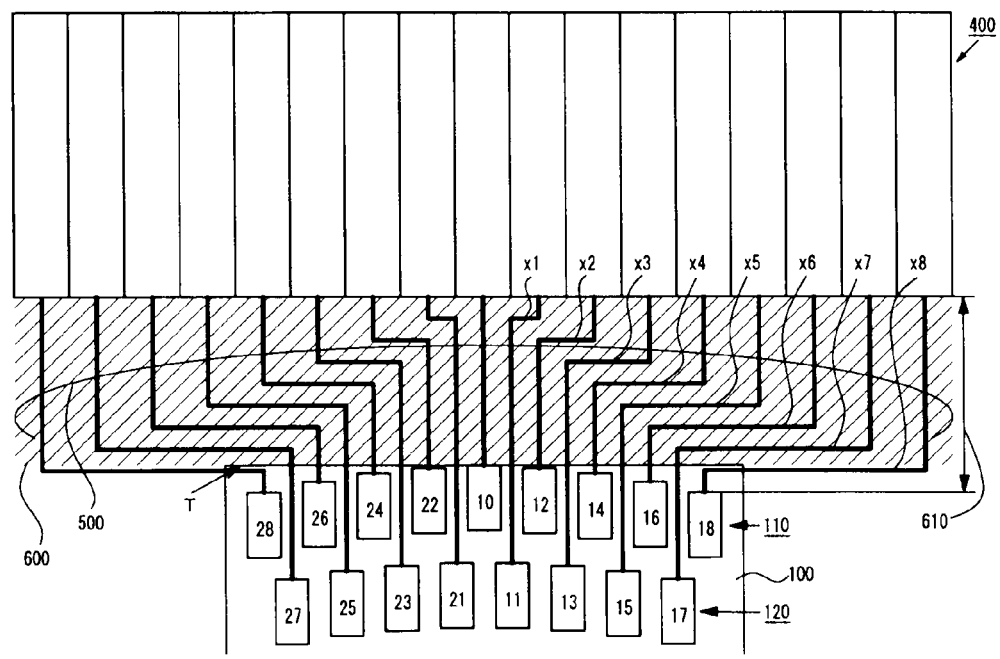
FIG. 1 is a block diagram illustrating a driving IC together with a display portion and a wiring pattern.

FIG. 1 is a block diagram illustrating a driving IC (driver element) 100 according to the present invention together with a display portion 400 to be driven by driving signals output from the driving IC 100 and a wiring pattern 500 in a wiring region 600. In this embodiment, the display portion 400 is a liquid crystal display portion employing TFT (Thin Film Transistor), and the driving IC 100 is a source driver to drive source electrodes in the liquid display portion. Further, the wiring pattern 500 includes wirings to connect the respective source wirings and electrode pads connected to the respective bumps.

In the example shown in FIG. 1, each wiring in the wiring pattern 500 is disposed linearly or as bent at 90°, between an electrode pad and a source wiring.

Here, in FIG. 1, vertically long rectangles in the display portion 400 correspond, respectively, to pixel columns connected to source wirings of the respective columns. Further, in the driving IC 100, bumps corresponding to input terminals are also formed, but in FIG. 1, only bumps to supply driving signals to source wirings in the display portion 400 are shown. Further, in FIG. 1, in the display portion 400, 17 columns are shown, and in the driver element 100, it is shown that 17 bumps are provided, but such numbers are merely exemplary.

In the driving IC 100 shown in FIG. 1, bumps are disposed in a staggering fashion. In the first row 110, bumps 10, 12, 14, 16, 18, 22, 24, 26 and 28 are disposed, and in the second row 120 remote from the display portion 400 than the first row, bumps 11, 13, 15, 17, 21, 23, 25 and 27 are disposed.

Further, in FIG. 1, it may appear that there is no substantial difference between the width of each bump and the width of each column in the display portion 400, but in reality, the width of each bump is narrow as compared with the width of each column in the display portion 400. As an example, the width of each column (the pixel width) in the display portion 400 is 70 μm, while the width of each bump (the short side of an approximate rectangle) is 24 μm, and the length of each bump (the long side of the approximate rectangle) is 100 μm. Further, the distance between each bump and its adjacent bump is 26 μm, and the distance between the rear end of a bump (the short side remote from the display portion 400) in the first row 110 and the forward end of a bump (the short side close to the display portion 400) in the second row 120 is 35 μm. Hereinafter, the approximate rectangle will be referred to as "rectangle". Here, the approximate rectangle is a concept including both a complete rectangle and a shape depart from a complete rectangle due to e.g. an accidental error in production which should otherwise be formed in a rectangle. Further in this specification, "forward end" is meant to include an end portion, and if the shape of a bump is rectangular, it is "a side", and if the shape of a bump is oval, it is an apex of an arc.

As shown in FIG. 1, the respective bumps 10, 12, 14, 16, 18, 22, 24, 26 and 28 are disposed so that the shortest distances from the long side T (the long side close to the display portion 400) when the driving IC 100 is mounted on a glass substrate (not shown), to the forward ends of the respective bumps become larger as the forward ends of the respective bumps in the array of the first row 110 depart from the bump 10 located at the center. That is, the respective bumps are disposed so that the shortest distances from the long side T to the forward ends of the bumps become larger gradually from the center outward in the arrays of the first row 110 and the second row 120. Here, the shortest distances may be regarded as the shortest distances between the forward ends of the respective bumps and a virtual line drawn in parallel with the long side T from the forward end of the bump at the center.

Further, in the array of the second row 120, the respective bumps 11, 13, 15, 17, 21, 23, 25 and 27 are disposed so that the forward ends of the respective bumps become remote from the long side T of the driving IC element 100 as they depart from bumps 11 and 21 located at the center in the second row 120.

Figure 2:
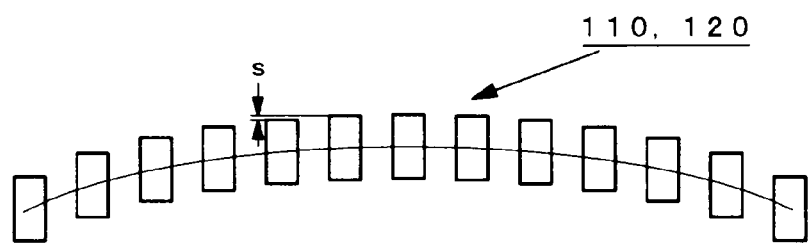
FIG. 2 is a schematic diagram illustrating disposition of bumps.

FIG. 2 is a schematic diagram illustrating disposition of bumps in each of the first row 110 and the second row 120. In FIG. 2, rectangles represent the respective bumps. As shown in FIG. 2, in each of the first row 110 and the second row 120, forward ends of the respective bumps are disposed in an arc so that their shortest distances from the long side T become larger gradually from the center outward in each row.

Here, the difference in size of the shortest distance at each bump from the shortest distance at the adjacent bump may be equal with respect to every bump, but it is preferred that the respective bumps are disposed so that the difference in size from the adjacent bump becomes larger gradually as the respective bumps depart from the center. That is, referring to FIG. 2, the height of the forward end of each bump (the position of the upper short side in FIG. 2) may be made uniformly lower than the height of the forward end of the adjacent bump from the center bump towards right and left in FIG. 2, but it is preferred that the degree of the increase in size of the shortest distance from the long side T shown in FIG. 1 is made larger as the respective bumps depart from the center bump towards right and left in FIG. 2. In other words, it is preferred that the difference s from the position of the forward end of the adjacent bump is made larger towards the ends of the array. Since wirings connected to bumps (specifically wirings connected to electrode pads to be connected to bumps) will be disposed, as they are located closer to the ends of array, at a region remote from the display portion 400 as other wirings are present on the center side, such a region can be more easily secured by such a construction.

Figure 3:
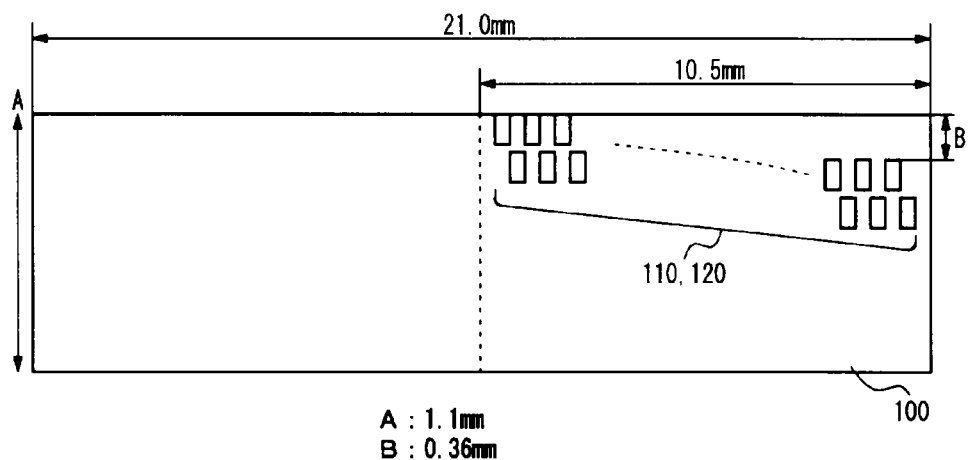
FIG. 3 is a schematic diagram illustrating an example of the size of a driving IC.

FIG. 3 is a schematic diagram showing an example of the size of a driving IC 100. In the example shown in FIG. 3, the width (the length of a long side) of the driving IC 100 is 21.0 mm, and the length of a short side is 1.1 mm. in each of the first row 110 and the second row 120, the difference between the forward end position of the center bump and the forward end position of the farthest end bump (the bump closest to a short side in the driver element 100) is 0.36 mm.

That is, the difference between the shortest distance at the center bump and the shortest distance at the farthest end bump is about ⅓ of the length of the short side of the driving IC 100. At the time of connecting the driving IC 100 to an electrode pad formed on a glass substrate, a thermocompression bonding method is employed, and at that time, a pressure is exerted to the surface of the driving IC 100 by a prescribed jig. If the difference is at most ⅓ of the length of the short side of the driving IC 100, at the time of the thermocompression bonding of the driving IC 100, the driving IC 100 is considered to be mounted on the glass substrate, while maintaining a constant height of the driving IC 100 from the surface of the glass substrate i.e. without inclination of the driving IC 100 against the glass substrate.

In FIG. 3, only bumps on the right hand side from the center are shown, but bumps are also provided on the left hand side.

As shown in FIG. 1, in a glass substrate, usually, the driving IC 100 is mounted to face the center portion of the display portion 400 i.e. not to face the ends of the display portion 400. However, as shown in FIG. 1, there are transversely extended portions x1 to x8 in the respective wirings between the display portion 400 and the electrode pads connected to the respective bumps in the driving IC 100. Therefore, a region (a wiring region 600) having an area in which they are disposed, is required.

In this embodiment, the forward ends of the respective bumps are disposed in an arc so that as they depart from the center outward in each row, they get farther away from the forward end of the center bump (FIG. 2), and thus, as compared with the wiring region 600, the area for wiring is substantially increased (reference symbol 610 in FIG. 1). Here, the wiring region 600 corresponds to the substantial wiring region in the case of employing a conventional driving IC 130.

Figure 4:
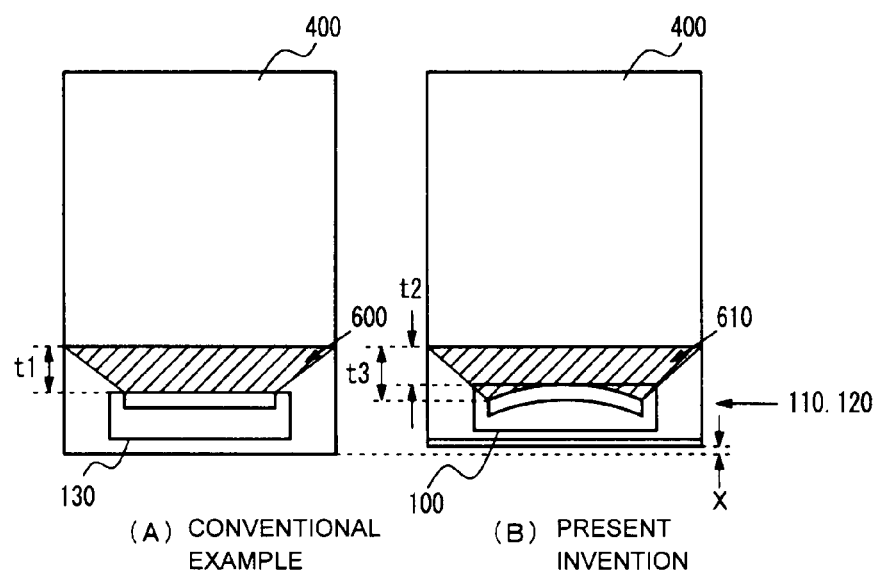
FIGS. 4(A) and (B) are schematic diagrams illustrating wiring regions.

FIGS. 4(A) and (B) are schematic diagrams illustrating wiring regions. As compared with the distance t1 between the display portion 400 and the long side on the display portion side of the driving IC 130 in a conventional example shown in FIG. 4(A), in this embodiment, as shown in FIG. 4(B), the distance t2 between the display portion 400 and the long side on the display portion side of the driving IC 100 can be made small. That is, in the case of this embodiment shown in FIG. 4(B), at an end portion of the driving IC 100 as mounted on a glass substrate, a region based on the distance t3 between the display portion 400 and the bump formed at the end portion can be used as a substantial wiring region 610, and therefore, the distance t2 may be smaller than the distance t1. Thus, as compared with the conventional example shown in FIG. 4(A), a non-display region can be made small (see X in FIG. 4(B)).

Further, in this embodiment shown in FIG. 4(B), if the distance t2 is modified to be equal to the distance t1, it becomes possible to increase the number of wirings as compared with the conventional example shown in FIG. 4(A).

Figure 5:
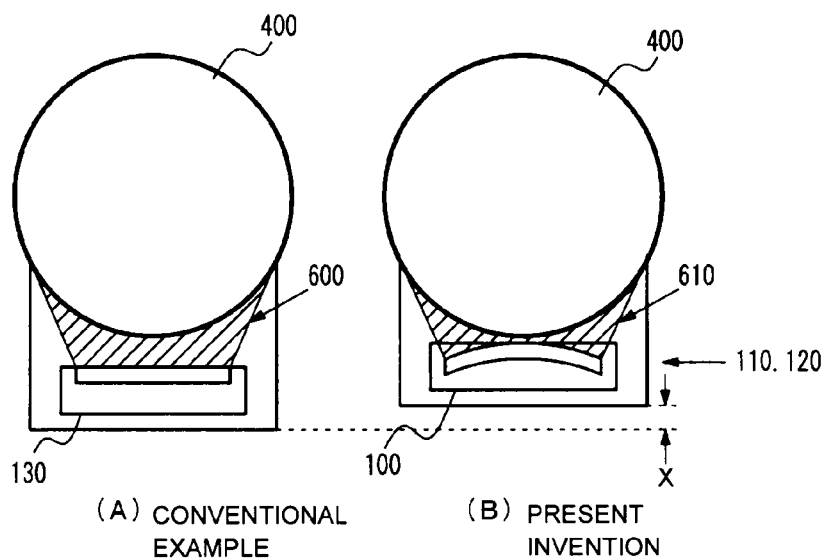
FIGS. 5(A) and (B) are schematic diagrams illustrating wiring regions.

While in FIGS. 4(A) and (B) show examples wherein the shape of the display portion 400 is rectangular, FIGS. 5(A) and (B) show examples wherein the shape of the display portion 400 is circular. In the case where the shape of the display portion 400 is circular, as compared with the case shown in FIGS. 4(A) and (B), the distance between the end portion in the driving IC 100 and the source wiring in the display portion 400 (the source wiring connected to an electrode pad to be connected to the bump at the end potion in the driving IC 100) becomes large. However, by using the driving IC 100 of this embodiment, such a distance can be substantially further increased. That is, as compared with the case where the shape of the display portion 400 is rectangular, it is possible to substantially increase the area of the wiring region 610. Here, FIG. 5(A) shows a conventional example, and FIG. 5(B) shows this embodiment.

Figure 6:
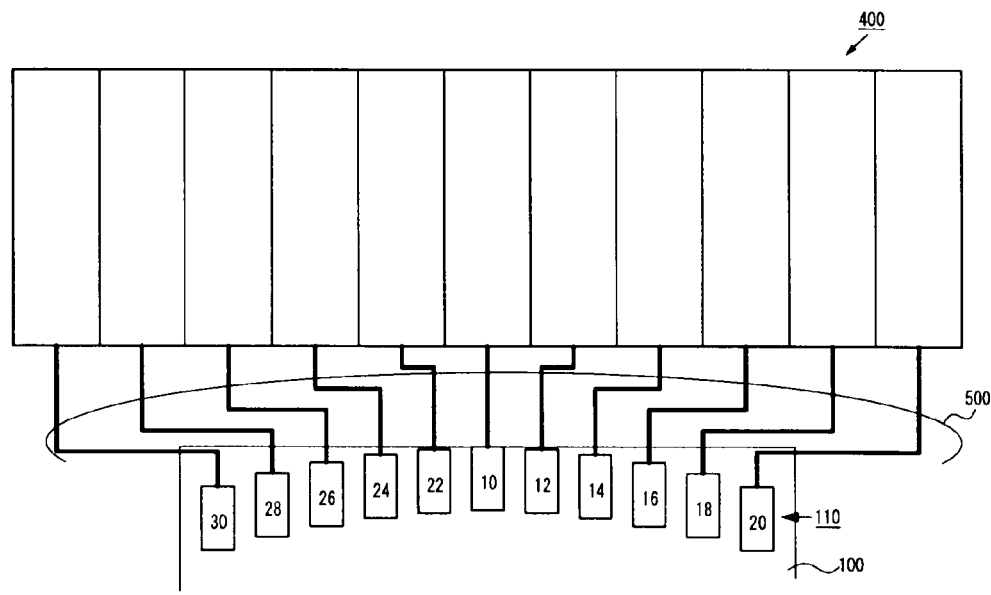
FIG. 6 is a block diagram illustrating a driving IC together with a display portion and a wiring pattern.

In this embodiment, a driving IC 100 is used wherein bumps are disposed in a staggering fashion, but as shown in FIG. 6, the present invention may be applied also to a case where bumps are disposed in one row only in a driving IC 100. Here, in FIG. 6, in the display portion 400, 11 columns are shown, and in the driver element 100, 11 bumps are formed, but such numbers are merely exemplary.

Figure 7:
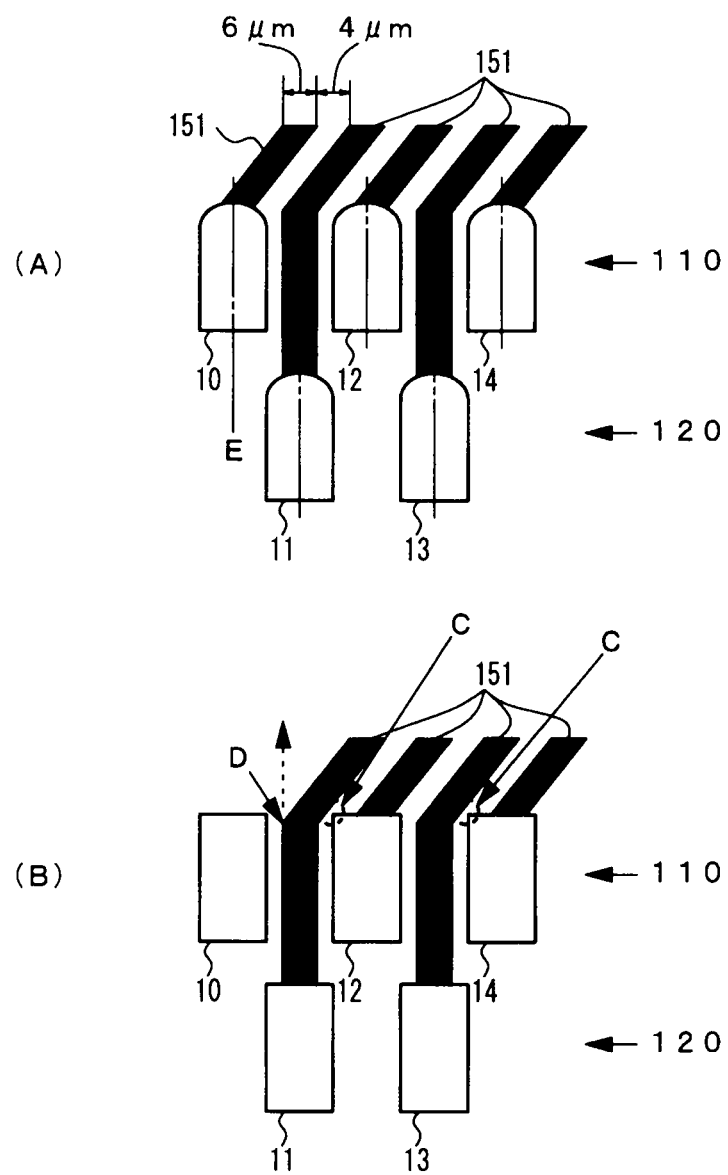
FIGS. 7(A) and (B) are schematic diagrams illustrating shapes of bumps.

FIG. 7(A) is a schematic diagram illustrating a preferred shape of bumps. FIG. 7(B) shows an example wherein the shape of bumps is rectangular. As shown in FIG. 7(B), in a case where the respective wirings 151 are disposed obliquely from bumps (specifically electrode pads connected to the bumps) towards the display portion 400 (not shown in FIG. 7), wirings 151 from bumps 11 and 13 in the second row 120 are preferably bent at a short side position on the display portion side of bumps 10, 12 and 14 in the first row and then directed to the display portion 400 in order not to let the wiring region be increased.

In a case where the shape of bumps is rectangular as shown in FIG. 7(B), the distance between a wiring 151 and a shoulder portion C of a bump 12 or 14 is likely to be too small at a position D where the wiring 151 from the bump 11 or 13 in the second row 120 is bent. As shown in FIG. 7(A), the wiring width is for example 6 μm, and the distance between wirings is for example 4 μm.

If, as shown in FIG. 7(A), the shape on the display portion side of a bump is made to be such a shape that a position at the center line E is closest to the display portion 400 and as a position departs from the center line E, it gets farther away from the display portion 400, it becomes easy to secure a distance between a wiring 151 and a bump 12 or 14 in the first row 110 at a place where a wiring 151 from a bump 11 or 13 in the second row 120 is bent. That is, it is preferred to have such a shape that forward end corner portions of a bump are cut off. The corner portions may be linearly cut off or rounded off. In FIG. 7(A), a case is shown where the corner portions are rounded off so that the forward end of a bump is made arc-like.

Figure 8:
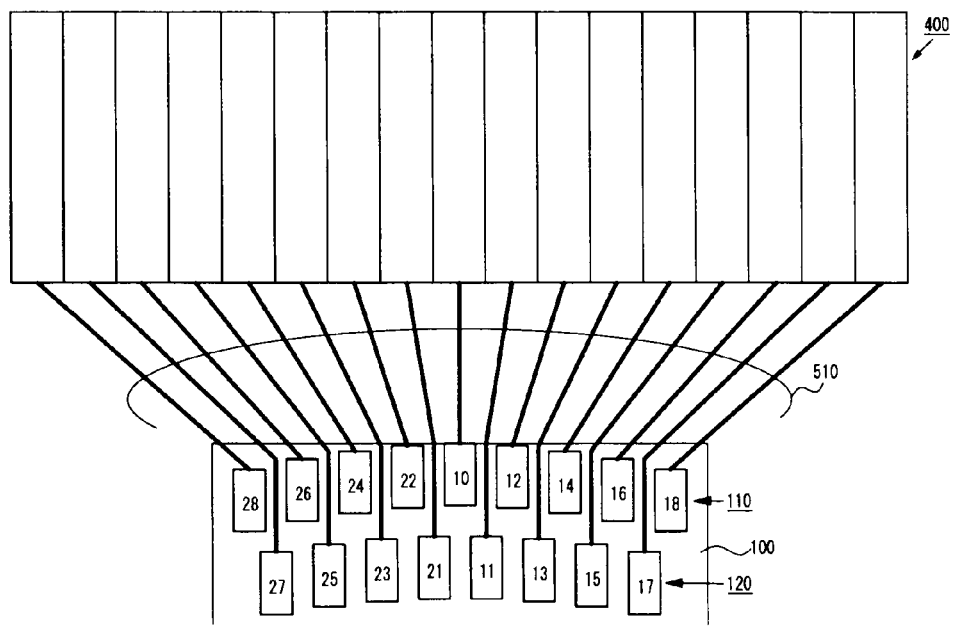
FIG. 8 is a block diagram illustrating a driving IC together with a display portion and a wiring pattern.
Figure 9:
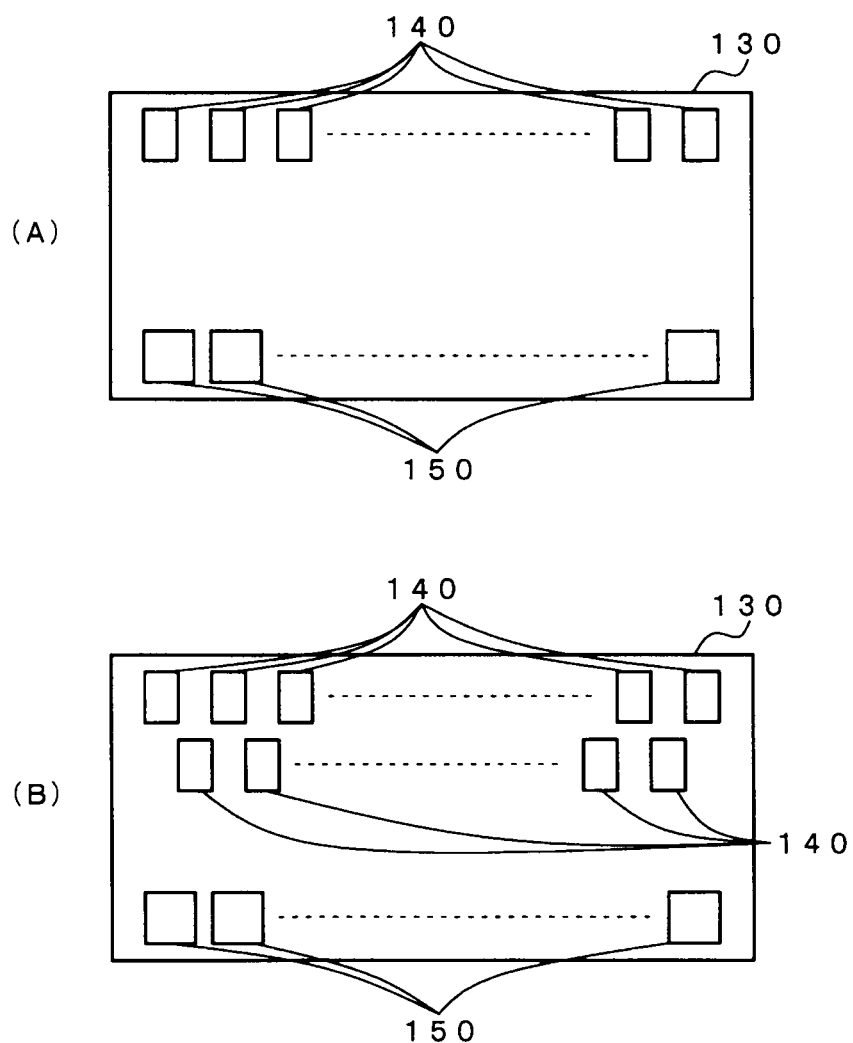
FIGS. 9(A) and (B) are block diagrams illustrating conventional driving ICs together with their display portions and wiring patterns.

Further, in a case where, as shown in the block diagram in FIG. 8, a wiring pattern 510 is taken wherein respective wirings are linearly disposed between the respective bumps and the display portion 400, it is more effective to employ a method wherein the shape on the display portion side of bumps is made to be a shape as shown in FIG. 7(A).

In the example shown in FIG. 7(A), a wiring 151 is formed so that the center line E of a bump agrees to the center line of the wiring 151, when the driving IC 100 is mounted on a glass substrate, but the wiring 151 may be formed so that such center lines get out of alignment. That is, in the example shown in FIG. 7(A), the wiring 151 may be made to be directed towards the display portion 400 from any position of the portion formed in an arc shape. That is, it is preferred to make the forward end shape of a bump to be an arc shape.

As described in the foregoing, according to the above-described embodiment, it is possible to increase the substantial wiring area between the display portion 400 and the driving IC 100. Further, as compared with a conventional case, it is possible to increase the number of wirings between the driving IC 100 and the display portion 400.

Further, in the above-described embodiment, the display portion 400 is a liquid crystal display portion employing TFT, but the present invention can be applied even if the display portion is a liquid crystal display portion employing STN (Super Twisted Nematic) liquid crystal or the like. Further, the present invention can be applied even if the display portion is an organic EL display portion.

Further, in the above-described embodiment, in the driving IC 100, the respective bumps are disposed so that the forward ends of the respective bumps get farther away from the forward end of the center bump as they depart from the center outward in the array with respect to the respective bumps located along the long side close to the display portion, as mounted on a glass substrate, but also with respect to the respective bumps located along the long side on the opposite side of the display portion i.e. the respective bumps to receive input signals, etc. for display, the respective bumps may be disposed so that their forward ends get farther away from the forward end of the center bump, as they depart from the center outward in the array.

The present invention is suitably applicable to a driving IC to be mounted on a substrate on which a display portion is mounted.

The entire disclosure of Japanese Patent Application No. 2010-264894 filed on Nov. 29, 2010 including specification, claims, drawings and summary is incorporated herein by reference in its entirety.

REFERENCE SYMBOLS 10, 11, 12, 13, 14, 15, 16, 17, 18, 21, 22, 23, 24, 25, 26, 27, 28: Bumps
  100: Driving IC (driver element)
  110: First row
  120: Second row
  151: Wiring
  400: Display portion
  500, 510: Wiring pattern
  600, 610: Wiring region
  x1 to x8: Transversely extended portions

What is claimed is:

1. A driver element having a rectangular shape, to be mounted on a display device containing a display portion, comprising:

bumps that are arrayed in an array within a perimeter of the rectangular driver element and along a side of the rectangular driver element which is located close to the display portion when mounted, the respective bumps are disposed so that shortest distances between forward ends of the respective bumps and the side that is along the array, become larger gradually from a center outward in the array, and when mounted, the respective bumps are connected to the display portion by respective wires of a wiring portion and the side of the rectangular driver element is positioned so that the perimeter of the rectangular driver element contains a different length section from each of the respective wires that are connected to the respective bumps positioned between the center and a farthest end from the center in the array.

2. The driver element according to claim 1, wherein the respective bumps are disposed so that a degree of change in size of the shortest distance at each of the bumps from the shortest distance at one of the bumps adjacent thereto becomes larger gradually as the respective bumps depart from the center of the array.

3. The driver element according to claim 1, wherein the respective bumps are formed along the side that is a long side of the rectangular driver element, and the respective bumps are disposed so that a difference between the shortest distance at one of the bumps that is at the center in the array and the shortest distance at one of the bumps that is a bump at the farthest end from the center in the array, is at most ⅓ of a length of a short side of the rectangular driver element.

4. The driver element according to claim 1, wherein a forward end shape of each of the bumps is arc-like.

5. The display device comprising the display portion and the driver element as defined in claim 1.

6. The driver element according to claim 1, wherein rear ends of the respective bumps, opposite to the forward ends, are parallel to one another and become gradually closer to the side of the rectangular driver element from the farthest end from the center in the array to the center in the array.

7. The driver element according to claim 1, wherein a width of each of the bumps in a direction along the side of the rectangular driver element is less than a pixel width in the display portion.

8. The driver element according to claim 1, wherein the bumps are equally spaced apart from one another in a direction along the side of the rectangular driver element.

9. The driver element according to claim 1, wherein the bumps are arrayed in more than one row.

* * * * *